(12) United States Patent
Xu

(10) Patent No.: US 7,576,604 B2
(45) Date of Patent: Aug. 18, 2009

(54) ALL-DIGITAL CLASS-D AUDIO AMPLIFIER

(75) Inventor: Bin Xu, 10465 Byrne Ave., Cupertino, CA (US) 95014

(73) Assignee: Bin Xu, Cupertino, CA (US)

( * ) Notice: Subject to any disclaimer, the term of this patent is extended or adjusted under 35 U.S.C. 154(b) by 0 days.

(21) Appl. No.: 11/611,410

(22) Filed: Dec. 15, 2006

(65) Prior Publication Data
US 2008/0143436 A1    Jun. 19, 2008

(51) Int. Cl.
    *H03F 3/38*    (2006.01)
(52) U.S. Cl. ........................................ 330/10
(58) Field of Classification Search ................ 330/10, 330/136, 207 A
    See application file for complete search history.

(56) References Cited
U.S. PATENT DOCUMENTS

| | | | |
|---|---|---|---|
| 5,559,467 A * | 9/1996 | Smedley | 330/10 |
| 5,789,975 A * | 8/1998 | Yoshida et al. | 330/10 |
| 6,297,692 B1 | 10/2001 | Nielsen | |
| 6,414,613 B1 | 7/2002 | Midya et al. | |
| 6,466,087 B2 | 10/2002 | Ruha | |
| 6,498,531 B1 | 12/2002 | Ulrick et al. | |
| 6,606,044 B2 | 8/2003 | Roeckner et al. | |
| 7,286,009 B2 * | 10/2007 | Andersen et al. | 330/10 |

OTHER PUBLICATIONS

Ribso, et al., "Performance of an All-Digital Power Amplification System," Presented at AES-104 Amsterdam, May 98, pp. 1-24.
Pascual, et al, "High-Fidelity PWM Inverter for Digital Audio Amplification: Spectral Analysis, Real-Time DSP Implementation, and Results," IEEE Transactions on Power Electronics, vol. 18, No. 1, Jan. 2003, pp. 473-485.

* cited by examiner

*Primary Examiner*—Robert Pascal
*Assistant Examiner*—Khiem D Nguyen

(57) ABSTRACT

An all-digital class-D audio amplifier and method of digitizing an analog signal comprises a pulse-width modulation (PWM) wave generator for generating a PWM wave; an interpolator for receiving an input audio signal, up-sample the input audio signal; and down-sample the input audio signal to a PWM wave switching frequency; an audio speaker for broadcasting an amplified version of the input audio signal; a pair of MOSFETs driven by the PWM wave and the input supply voltage, wherein the pair of MOSFETs transmit the amplified version of the input audio signal to the audio speaker; a natural-sampling and pre-distortion circuit adapted to (i) generate a pre-distorted natural-sampling frequency point for the PWM wave switching frequency, and (ii) account for digitized power supply ripples for an input supply voltage used to drive the audio speaker; and an analog-to-digital converter (ADC) adapted to digitize the power supply ripples or distortion.

21 Claims, 7 Drawing Sheets

ALL-DIGITAL CLASS-D AUDIO AMPLIFIER

BACKGROUND

1. Technical Field

The embodiments herein generally relate to electrical components, and, more particularly, to class-D audio amplifiers.

2. Description of the Related Art

Class-D is a switching-based audio amplifier technology and theoretically it can achieve approximately 100% power efficiency. Traditional Class-AB audio amplifiers typically have much lower efficiency. FIG. 1 shows a typical power efficiency comparison between a class-D amplifier and a class-AB amplifier. For portable devices such as MP3 players and multi-media cell phones, etc., where the battery power consumption is critical, users are motivated to use more power efficient class-D audio amplifiers to replace the current market-dominant class-AB amplifiers, which only has approximately 20-30% efficiency for portable digital audio applications.

The major technology barrier to overcome in order to make a good quality class-D audio amplifier is to provide a sufficient power supply rejection ratio (PSRR). Class-D uses a pair of metal-oxide-semiconductor field-effect transistors (MOSFETs) power transistors, switched on and off by the input pulse-width modulation (PWM) waves, to drive the speaker load, as shown in FIG. 2. If no measure is taken; i.e., PSRR=0 dB, any VCC power rail ripples will directly propagate to the output load, thus destroying the signal-to-noise ratio/total harmonic distortion (SNR/THD+N) performance of the audio amplifier. A high-end audio amplifier is usually specified with >90 dB SNR. Considering the power rail noise level is in the order of 10 mV (−40 dB), a PSRR of approximately 50 dB generally must be provided in order to deliver 40 dB+50 dB≈90 dB SNR.

Currently, the commercially-available class-D amplifiers are generally all analog-type as shown in FIG. 3. The PSRR is provided by the analog feedback loop which corrects the distortion on the analog output by comparing with the ideal analog input signal through a feedback loop filter. Typically, these analog class-D audio amplifiers can only work in high-power (>10 W) applications such as home theatres and flat panel televisions with good power efficiencies (approximately 90%). For low-power portable device applications, where the power consumption is typically in the range of 10-100 mW, the analog class-D power efficiency drops to <30% due to overhead analog circuitry of analog class-D; i.e., the feedback loop and an external digital-to-analog converter (DAC) to convert the digital input into analog input. Currently, for portable digital audio applications, there are no suitable commercial class-D audio amplifiers. Accordingly, conventional analog-type class-D audio amplifier generally cannot achieve a power efficiency greater than 90% for low-power portable applications in the 10-100 mW range. As such, those skilled in the art would readily acknowledge that there remains a need for a power-efficient class-D audio amplifier for portable digital audio applications that can deliver a sufficient PSRR performance.

SUMMARY

In view of the foregoing, an embodiment provides an all-digital class-D audio amplifier comprising a PWM wave generator adapted to generate a PWM wave; an interpolator adapted to receive an input audio signal, up-sample the input audio signal; and down-sample the input audio signal to a PWM wave switching frequency; an audio speaker adapted to broadcast an amplified version of the input audio signal; a pair of MOSFETs driven by the PWM wave and the input supply voltage, wherein the pair of MOSFETs transmit the amplified version of the input audio signal to the audio speaker; a natural-sampling and pre-distortion circuit adapted to (i) generate a pre-distorted natural-sampling frequency point for the PWM wave switching frequency, and (ii) account for digitized power supply ripples for an input supply voltage used to drive the audio speaker; and an analog-to-digital converter (ADC) adapted to digitize the power supply ripples or distortion.

The all-digital class-D audio amplifier may further comprise digital circuitry adapted to provide a PSRR performance by using digital signal processing to pre-distort a natural-sampling point of the PWM wave and by digitizing the power supply ripples using the ADC. Moreover, the all-digital class-D audio amplifier may further comprise digital circuitry adapted to provide reduced THD by using digital signal processing to pre-distort a natural-sampling point of the PWM wave and by digitizing the power supply ripples using the ADC. Also, the input audio signal is preferably digital with sampling rates at 32 khz, 48 khz, 96 khz, and 192 khz. Alternatively, the input audio signal is preferably digital with sampling rates at 44.1 khz, 88.2 khz, and 176.4 khz.

Preferably, the ADC operates at a frequency that is higher than the PWM wave switching frequency. Furthermore, a natural-sampling point of the PWM wave is preferably pre-distorted in a digital domain through digital signal processing and using the digitized power supply voltage ripples or distortion by the ADC. Moreover, the natural-sampling point may be calculated in the digital domain through digital signal processing by finding a cross-point of a sawtooth waveform of the PWM wave with the input audio signal. Additionally, the pre-distorted natural-sampling point may be calculated in the digital domain through digital signal processing by finding a cross-point of a sawtooth waveform of the PWM wave with the input audio signal with the digitized power supply by the ADC including power supply ripples or distortion.

Preferably, power supply ripples propagating to the audio speaker and the pre-distorted PWM wave cancel each other resulting in an ideal PWM wave driving the audio speaker as if the power supply ripples were non-existent or much reduced, and therefore gaining PSRR performance for the all-digital class-D audio amplifier. Furthermore, power supply distortion due to operations of electrical components propagating to the audio speaker and the pre-distorted PWM wave preferably cancel each other resulting in an ideal PWM wave driving the audio speaker as if the power supply distortions were non-existent or much reduced, and therefore gaining THD performance for the all-digital class-D audio amplifier.

Also, the all-digital class-D audio amplifier may further comprise a decimation circuit adapted to decimate digitized power supply ripples at a sampling rate from the frequency that the ADC operates at to the PWM wave switching frequency. Moreover, the all-digital class-D audio amplifier may further comprise at least a third order digital sigma-delta type modulator adapted to shape quantization noise out of the input audio signal. Additionally, the all-digital class-D audio amplifier may further comprise a digital predictor circuit adapted to predict a difference in a value of the power supply voltage at anytime during an immediately subsequent PWM cycle using power supply voltage difference values from one or more immediately previous PWM cycles.

Moreover, the all-digital class-D audio amplifier may further comprise a PSRR in a range from 20 dB to 80 dB. Furthermore, the all-digital class-D audio amplifier may further comprise a power efficiency of greater than 90% for low-power portable digital audio applications in an approximate range of 10-100 mW.

Another embodiment provides a system for amplifying an audio signal, wherein the system comprises digital circuitry; an audio signal source adapted to generate an input audio signal; an audio speaker adapted to transmit an amplified input audio signal; a pair of MOSFETs adapted to transmit the amplified input audio signal to the audio speaker; and a class-D audio amplifier adapted to achieve a PSRR in a range of 20 dB to 80 dB, wherein the class-D audio amplifier comprises a PWM wave generator adapted to generate a PWM wave, wherein the PWM wave drives the pair of MOSFETs; an interpolator adapted to receive an input audio signal, up-sample the input audio signal; and down-sample the input audio signal to a PWM wave frequency; a natural-sampling and pre-distortion circuit adapted to (i) generate a pre-distorted natural-sampling frequency point for the PWM wave frequency, and (ii) account for digitized power supply ripples for an input supply voltage used to drive the audio speaker; at least a third order digital sigma-delta type modulator adapted to shape quantization noise out of the input audio signal; and an ADC adapted to digitize the power supply ripples, wherein the ADC operates at a frequency that is higher than the PWM wave frequency; wherein the digital circuitry is adapted to provide a PSRR performance using digital signal processing and by digitizing the power supply ripples using the ADC; and provide a reduced THD using digital signal processing and by digitizing the power supply distortion using the ADC.

Another embodiment provides a method of amplifying an audio signal transmitted through an audio speaker, wherein the method comprises generating an input audio signal; generating a PWM wave; up-sampling and down-sampling the input audio signal to a PWM wave switching frequency; generating a pre-distorted natural-sampling frequency point for the PWM wave switching frequency; shaping quantization noise out of the input audio signal; digitizing a power supply ripple for an input supply voltage used to drive the audio speaker; and transmitting the digitized audio signal through the audio speaker, wherein the digitized audio signal comprises a PSRR in a range of 20 dB to 80 dB.

Additionally, the method may further comprise providing a PSRR performance by using digital signal processing to pre-distort a natural-sampling point of the PWM wave and by digitizing the power supply ripples using the ADC. Moreover, the method may further comprise providing reduced THD by using digital signal processing to pre-distort a natural-sampling point of the PWM wave and by digitizing the power supply ripples using the ADC.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

Figure 1:
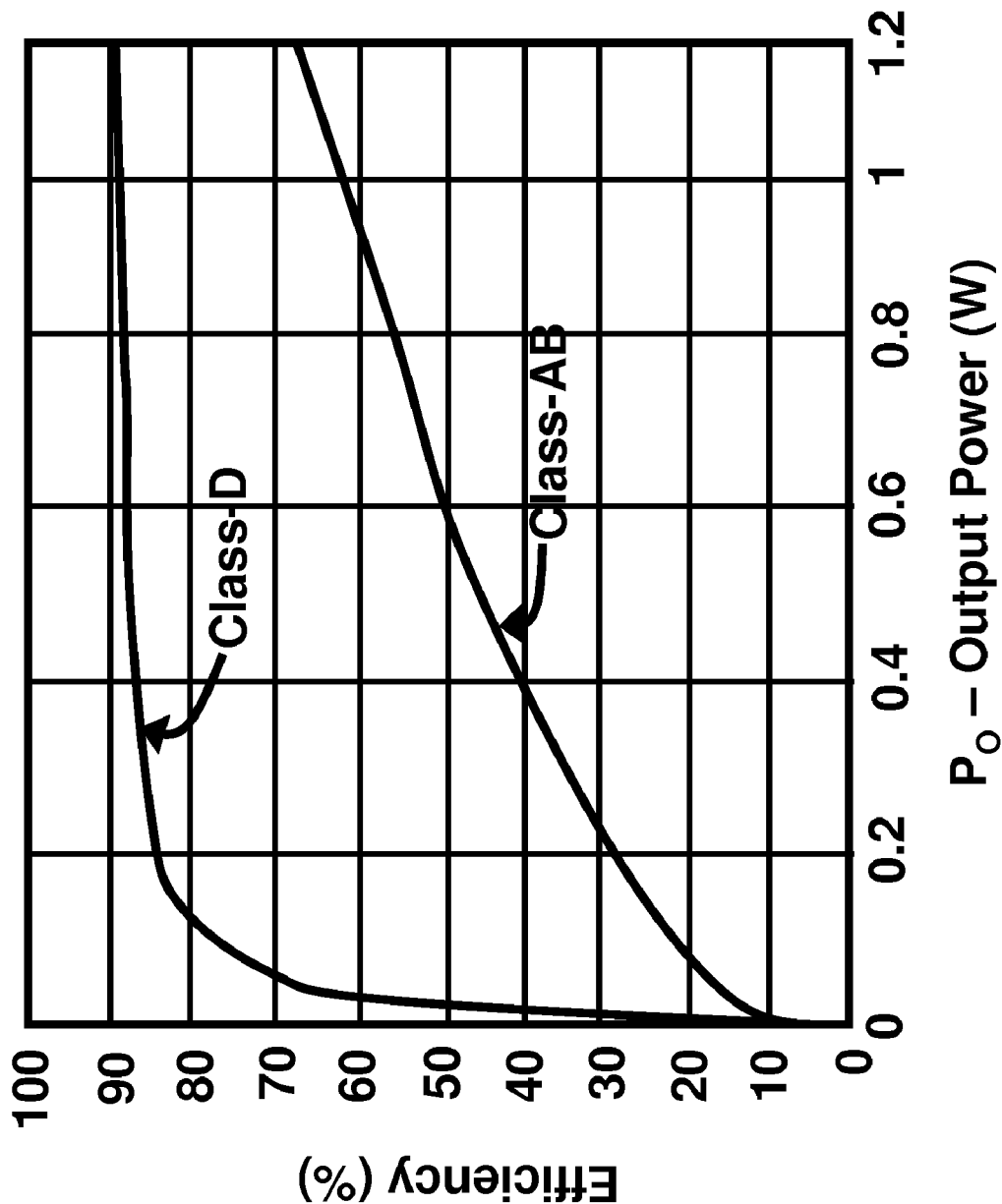
FIG. 1 is a graphical representation illustrating a typical power efficiency comparison between a class-D amplifier and a class-AB amplifier.
Figure 2:
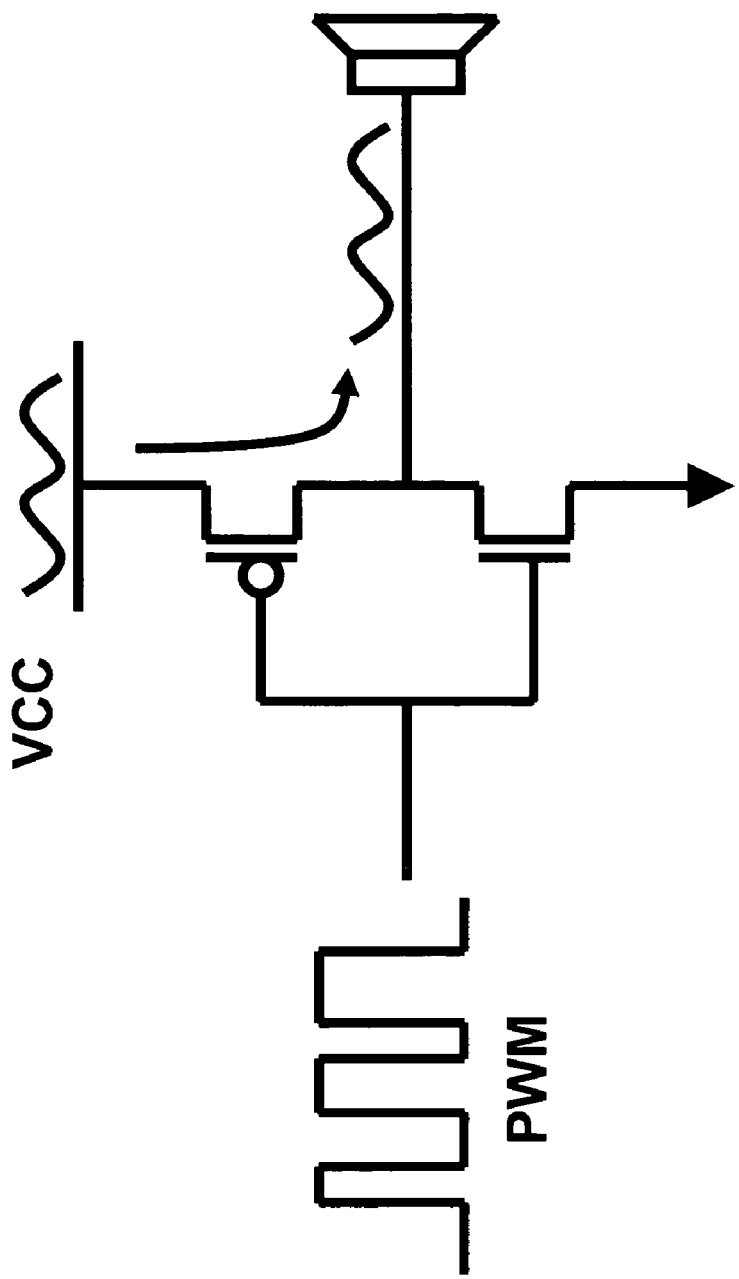
FIG. 2 illustrates a schematic electrical diagram of a class-D amplifier.
Figure 3:
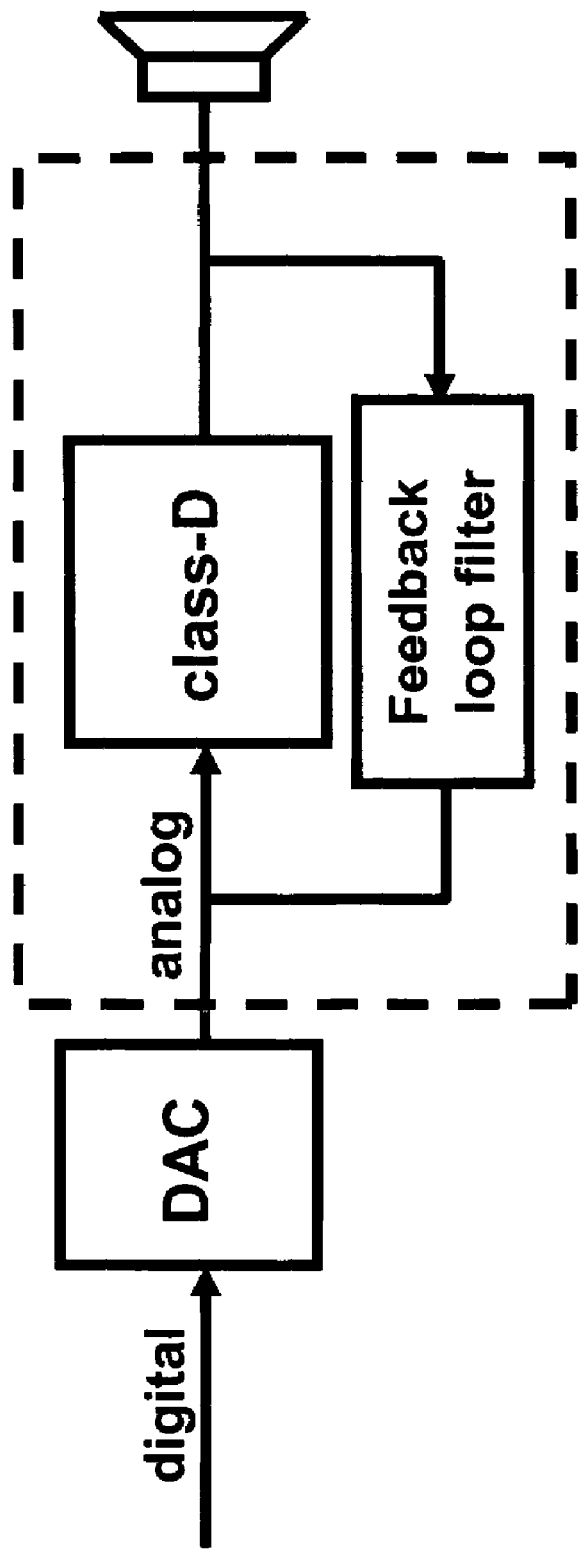
FIG. 3 illustrates a schematic block diagram of an analog class-D amplifier.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, there remains a need for power-efficient class-D audio amplifiers for portable applications. The embodiments herein achieve this by providing an all-digital class-D audio amplifier to be used in portable digital audio players powered by a battery with a power efficiency greater than 90%. Referring now to the drawings, and more particularly to FIGS. 4 through 7, where similar reference characters denote corresponding features consistently throughout the figures, there are shown preferred embodiments.

Figure 4:
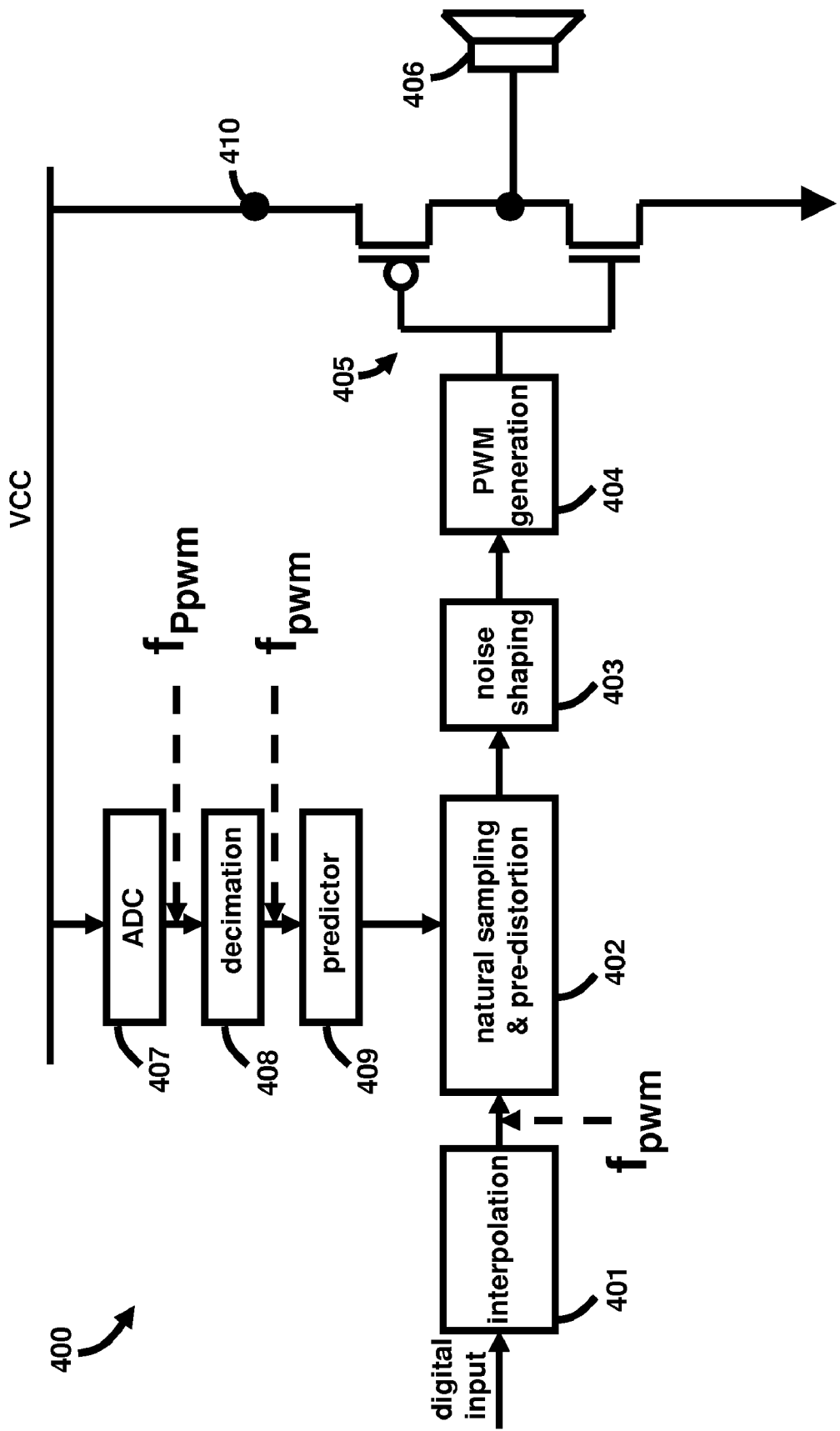
FIG. 4 illustrates a schematic diagram of an all-digital class-D audio amplifier according to an embodiment herein.

FIG. 4 illustrates a novel all-digital class-D audio amplifier 400 with a high power supply rejection ratio (PSRR>60 dB). The input signal is digital with sampling rates at 32 khz, 48 khz, 96 khz, 192 khz, or 44.1 khz, 88.2 khz, 176.4 khz. The interpolator 401 up-samples and re-samples the input signals to a sampling rate which is the same as the PWM frequency $f_{PWM}$. The $f_{PWM}$ is typically several hundred kilohertz. The up-sampling and re-sampling is done through an interpolator 401 implemented using a digital filter, which can be either a polyphase finite impulse response (FIR) filter or cascaded integrator-comb (CIC) filter. The natural-sampling and pre-distortion circuit 402 takes into account the digitized power supply ripples and generates a natural-sampling point with pre-distortion. The natural-sampling point with pre-distortion is defined as the cross-point of a PWM sawtooth waveform and the input audio signal Vin. Shown in FIG. 5, the cross-point with ideal power supply VCC_ideal gives natural-sampling point n. When the power supply has a ripple ΔVCC and power supply voltage shifts accordingly to VCC=VCC_idela+ΔVCC, the natural-sampling for PWM will be distorted from n to p, which changes to the duty cycle of the PWM waveform from n/PWM_osratio to p/PWM_osratio. The PWM_osratio is the granularity determining how small a PWM switching period (T=1/$f_{PWM}$) can be sub-divided in the digital domain. Typically, the PWM_ratio is an integer of 2's power. The resulting pre-distorted PWM wave drives the power-stage MOSFET devices 405. The power supply ripples or distortion combine with the pre-distorted PWM at the output of p/n MOSFET pair and they cancel each, ending up with an ideal PWM driving the load (speaker 406) as if there is no power supply ripples or distortion. The speaker 406 can be in headphone, earphone, or any type of loudspeaker. The power supply is resulted from non-ideal power supply conditions, for example, non-zero power supply resistance; other devices hooked up to the power supply will perturb power supply voltage, etc. This method therefore provides an effective way to cancel or remove the power supply ripple or distortion. Or equivalently, this method provides a PSRR and reduced total harmonic distortion (THD) for the all-digital class-D audio amplifier herein.

The power supply ripples or distortion are any deviations of the power supply voltage from its ideal value; i.e., ΔVCC=VCC–VCC_ideal, at the connection point 410 between the power supply and power MOSFET stage (shown as the p/n MOSFET pair 405 in FIG. 4). These deviations are results of power supply ripples, noise, transients, or voltage fluctuations caused by the operations of class-D audio amplifier itself (power supply distortion) or other devices hooked up with the same power supply (power supply ripples).

In FIG. 4, the ADC 407 which digitizes the power supply ripple is a high-speed, high-resolution, low-power analog-to-digital converter, which operates at frequency $f_{Ppwm}$. The $f_{Ppwm}$ is typically in the approximate range of 200 khz to 100 Mhz. The resolution is typically in the approximate range of 14 bits-18 bits. The power consumption should preferably be as small as possible, typically in the approximate range of 1-10 mW. The sampling frequency of this ADC $f_{Ppwm}$ is typically higher than the PWM frequency $f_{pwm}$ in order to achieve real-time digitalization of the power supply ripple. There is a decimation circuit 408 to decimate digitized power supply ripples at sampling rate from $f_{Ppwm}$ to $f_{pwm}$. The decimation circuit 408 can be a polyphase FIR or infinite impulse response (IIR) digital filter, or cascaded integrator-comb (CIC) decimator.

Figure 5:
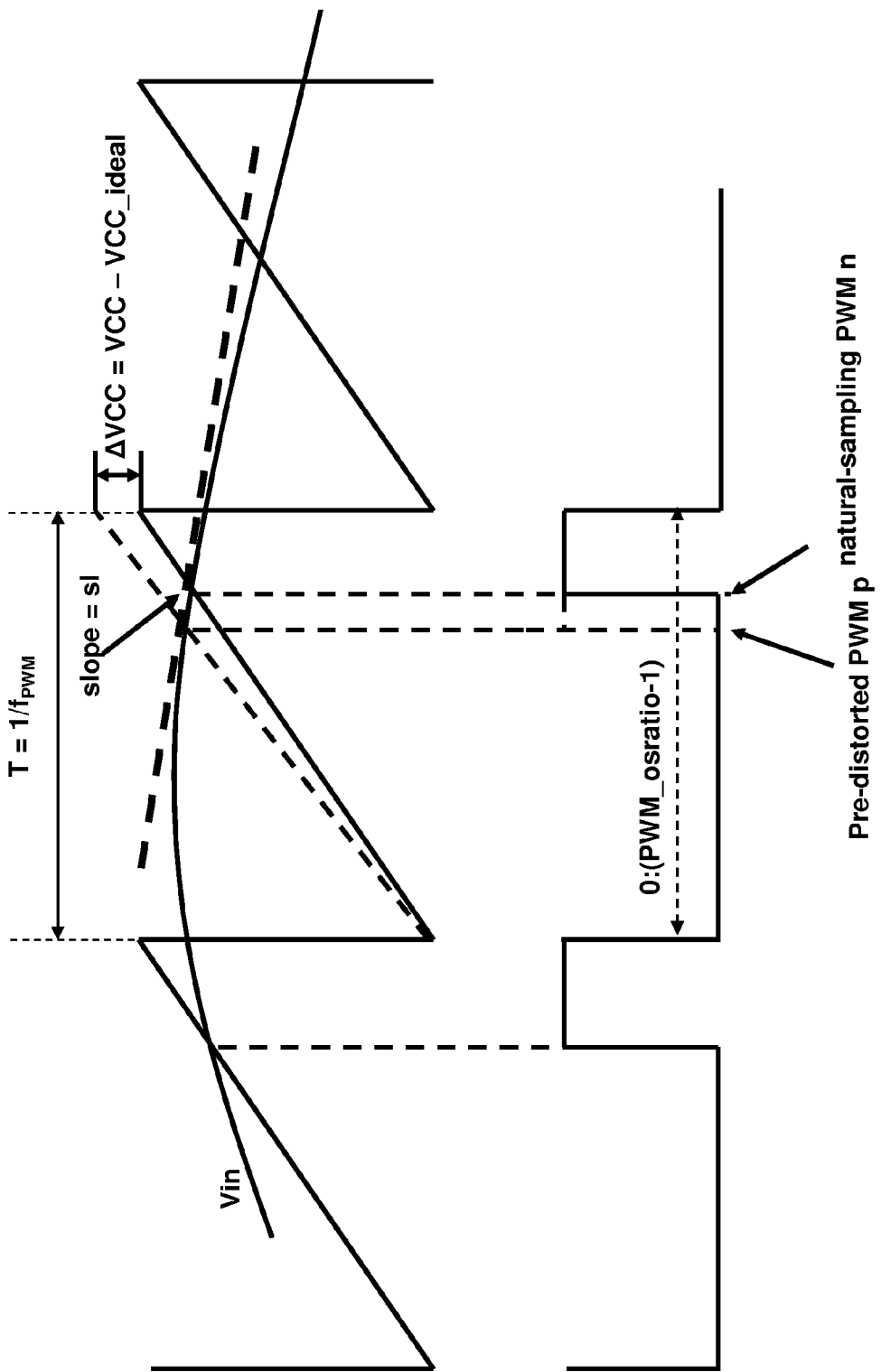
FIG. 5 is a graphical representation illustrating the relationship of the pre-distorted natural-sampling point to the digitized power supply ripple according to an embodiment herein.

FIG. 5 describes that the natural-sampling point is pre-distorted according to the digitized power supply ripple following Equation (1) below:

$$p=(1-sl)/(1-sl+\Delta VCC)*n \quad (1)$$

In the above expression, the sl is the slope of the input audio signal Vin at this natural-sampling point. The n is the original natural-sampling point with ideal power supply VCC_ideal, and p is the pre-distorted natural-sampling point. Again with respect to FIG. 4, the PWM that drives the MOSFET power stage 405 is generated by PWM generator 404 according to pre-distorted natural-sampling point p instead of the original natural-sampling point n. Accordingly, when the power supply ripples combine with the pre-distorted PWM after the p/n MOSFET pair 405, they cancel each other.

The pre-distorted natural-sampling point is calculated in the digital domain at the beginning of a PWM switching cycle by following Equation (1). This requires the power supply ripple ΔVCC to be digitized by ADC 407 and feedbacks this information during the same PWM switching cycle. However, in hardware implementation, there is always an unavoidable delay gap in time domain which makes digitized ΔVCC lag behind by a small amount of time interval. Therefore a predictor circuit 409 is used as shown in FIG. 4, which predicts or extrapolates the digitized ΔVCC value to fill this delay gap. This makes the digitized ΔVCC value real-time. This predictor 409 can be made by using curve fitting to extrapolate or by using an adaptive FIR filtering technique. The curve fitting can be second-order by using two previous points of the digitized ΔVCC values; third-order by using three previous points of the digitized ΔVCC values; or any n-th order by using n previous points of the digitized ΔVCC values. The curve fitting is carried out in the digital domain through digital signal processing.

A noise-shaping circuit 403 follows the natural-sampling and pre-distortion circuit 402 to shape the quantization noise out of the audio band. Otherwise, the quantization of the input audio signal Vin by granularity of PWM_ratio will give a large quantization noise in the audio band which will destroy the SNR performance of the audio amplifier. This noise shaper 403 can be a higher-order (greater than third) sigma-delta type of modulator, implemented in the digital domain, with a sampling frequency at the same PWM frequency.

Figures 6A, 6B:
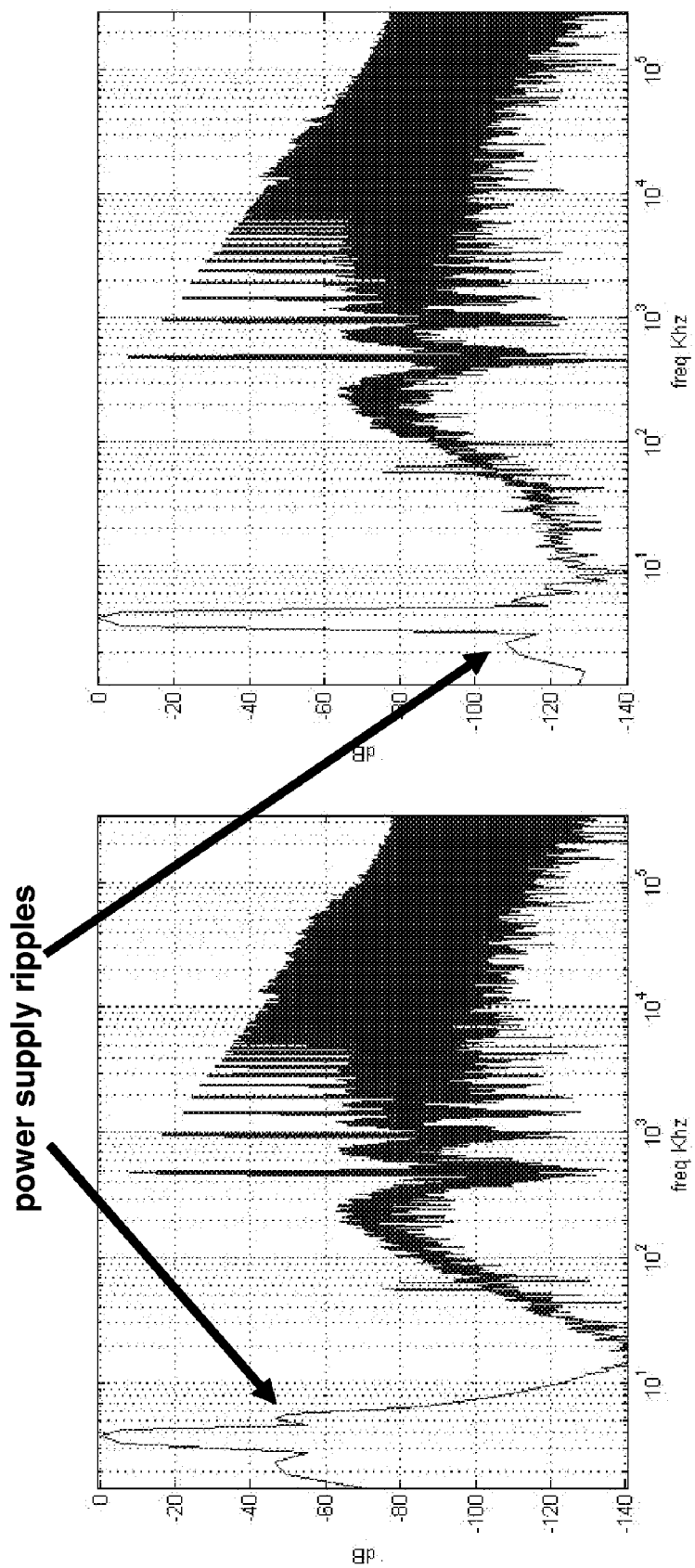
FIG. 6(A) is a graphical representation illustrating an output spectrum of the all-digital class-D audio amplifier of FIG. 4 without power supply rejection according to an embodiment herein.
FIG. 6(B) is a graphical representation illustrating an output spectrum of the all-digital class-D audio amplifier of FIG. 4 with power supply rejection according to an embodiment herein.

FIGS. 6(A) and 6(B) illustrate the computer-simulated spectrum of the all-digital class-D audio amplifier to demonstrate the PSRR technique described herein. The input signal is at 3.75 khz with –40 dB power supply ripples at 1.5 khz. FIG. 6(A) illustrates the spectrum without power supply rejection; FIG. 6(B) illustrates the spectrum with power supply rejection turned on; that is, the power supply ripples at the output, located at 3.75 khz±1.5 khz is suppressed by >60 dB. The class-D audio amplifier without a PSRR has a poor audio performance because the audio quality at the speaker output is subject to any power supply noise or ripples and total harmonic distortion (THD). Accordingly, the all-digital class-D audio amplifier 400 (of FIG. 4) can achieve a PSRR>60 dB by measuring the power supply ripple peak reduction which is from –43 dB shown in FIG. 6(A) to less than –103 dB as shown in FIG. 6(B).

Figure 7:
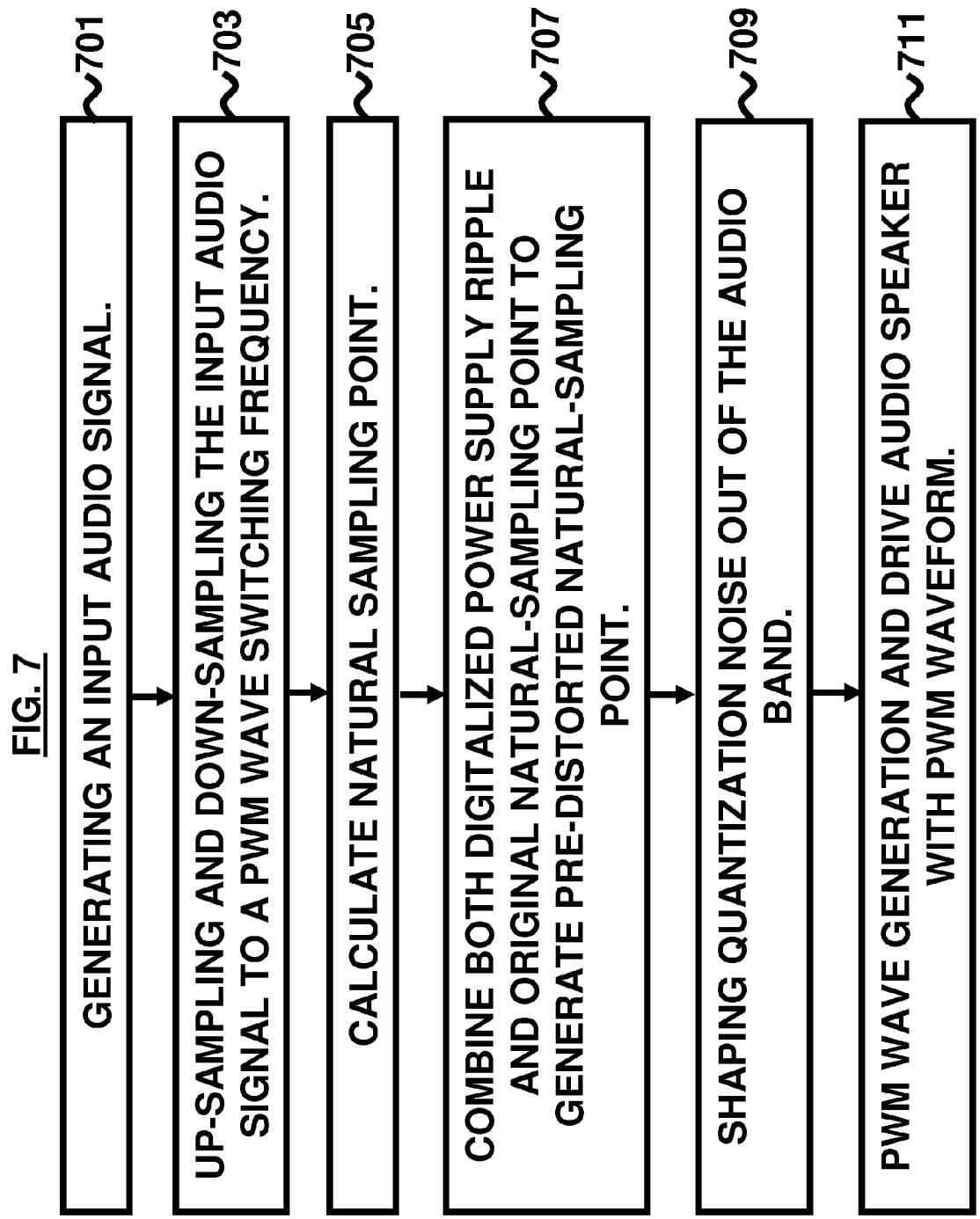
FIG. 7 is a flow diagram illustrating a preferred method according to an embodiment herein.

FIG. 7, with reference to FIGS. 4 through 6, is a flow diagram illustrating a method for amplifying an audio signal through an audio speaker according to an embodiment herein, wherein the method comprises generating (701) an input audio signal; up-sampling and down-sampling (703) the input audio signal to a PWM wave switching frequency; calculating (705) a natural sampling point; combining (707) both digitalized power supply ripple and original natural-sampling point to generate a pre-distorted natural-sampling point; shaping (709) quantization noise out of the audio band; and driving (711) the audio speaker with a PWM waveform.

The embodiments herein provide a general-purpose all-digital class-D audio amplifier 400 with PSRR and THD performance. This general-purpose all-digital class-D audio amplifier 400 is not only applicable to portable devices, but also it can be applied to make high-power audio amplifiers for home-theatre systems, automobile audios, flat-panel TVs, and other audio applications which require high power efficiency.

The techniques provided by the embodiments herein may be implemented on an integrated circuit (IC) chip or using printable electronic technologies (not shown). The chip or printable electronic circuit design is created in a graphical computer programming language, and stored in a computer storage medium (such as a disk, tape, physical hard drive, or virtual hard drive such as in a storage access network). If the designer does not fabricate chips or printable electronic circuits or the photolithographic masks used to fabricate chips or printable electronic circuits, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII or CIF) for the fabrication of photolithographic masks, which typically include multiple copies of the chip design in question that are to be formed on a wafer or printed on a suitable substrate. The photolithographic masks are utilized to define areas of the wafer or printable electronic circuits (and/or the layers thereon) to be etched or otherwise processed or printed.

The resulting integrated circuit chips or printable electronic circuits can be distributed by the fabricator in raw wafer form (that is, as a single wafer that has multiple unpackaged chips), as a bare die, or in a packaged form or as individual printed circuits or in a sheet or roll of printed circuits. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip might then be integrated with other chips, discrete circuit elements, and/or other signal processing devices as part of either (a) an intermediate product, such as a mother or daughter-board, or (b) an end product. The end product can be any product that includes integrated circuit chip or chips and/or printed circuits, ranging from toys and other low-end applications to advanced computer products having a display, a keyboard or other input device, and a central processor.

The techniques provided by the embodiments herein may also be implemented on printed circuit board (PCB) using discrete components. In this case, the electronic circuit components described herein, such as the ADC 407, decimator 408, predictor 409, interpolator 401, natural-sampling and pre-distortion unit 402, noise shaping unit 403, and MOSFET pair 405 can use discrete components and these discrete components are electronically connected on the printed circuit board (not shown) to perform the functions of the all-digital class-D audio amplifier 400 described herein.

Generally, the embodiments herein provide a system and method for amplifying an audio signal comprising generating an input audio signal; generating a PWM wave; up-sampling and down-sampling the input audio signal to a PWM wave switching frequency; generating a pre-distorted natural-sampling frequency point for the PWM wave switching frequency; shaping quantization noise out of the input audio signal; digitizing a power supply ripple for an input supply voltage used to drive the audio speaker; and transmitting the digitized audio signal through the audio speaker, wherein the digitized audio signal comprises a PSRR in a range of 20 dB to 80 dB. The method may further comprise providing a PSRR performance by using digital signal processing to pre-distort a natural-sampling point of the PWM wave and by digitizing the power supply ripples using an ADC. Additionally, the method may further comprise providing reduced THD by using digital signal processing to pre-distort a natural-sampling point of the PWM wave and by digitizing the power supply ripples using the ADC.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation.

Therefore, while the embodiments herein have been described in terms of preferred embodiments, those skilled in the art will recognize that the embodiments herein can be practiced with modification within the spirit and scope of the appended claims.

What is claimed is:

1. An all-digital class-D audio amplifier comprising:
   a pulse-width modulation (PWM) wave generator adapted to generate a PWM wave;
   an interpolator adapted to receive an input audio signal, up-sample said input audio signal; and down-sample said input audio signal to a PWM wave switching frequency;
   an audio speaker adapted to broadcast an amplified version of said input audio signal;
   a pair of metal-oxide-semiconductor field-effect transistors (MOSFETs) driven by said PWM wave and said input supply voltage, wherein said pair of MOSFETs transmit said amplified version of said input audio signal to said audio speaker;
   a natural-sampling and pre-distortion circuit adapted to (i) generate a pre-distorted natural-sampling frequency point for said PWM wave switching frequency, and (ii) account for digitized power supply ripples for an input supply voltage used to drive said audio speaker; and
   an analog-to-digital converter (ADC) adapted to digitize said power supply ripples or any power supply distortion.

2. The all-digital class-D audio amplifier of claim 1, further comprising digital circuitry adapted to provide a power-supply rejection ratio (PSRR) performance by using digital signal processing to pre-distort a natural-sampling point of said PWM wave and by digitizing said power supply ripples using said ADC.

3. The all-digital class-D audio amplifier of claim 1, further comprising digital circuitry adapted to provide reduced total harmonic distortion (THD) by using digital signal processing to pre-distort a natural-sampling point of said PWM wave and by digitizing said power supply ripples using said ADC.

4. The all-digital class-D audio amplifier of claim 1, wherein said input audio signal is digital with sampling rates at 32 khz, 48 khz, 96 khz, and 192 khz.

5. The all-digital class-D audio amplifier of claim 1, wherein said input audio signal is digital with sampling rates at 44.1 khz, 88.2 khz, and 176.4 khz.

6. The all-digital class-D audio amplifier of claim 1, wherein said ADC operates at a frequency that is higher than said PWM wave switching frequency.

7. The all-digital class-D audio amplifier of claim 1, wherein a natural-sampling point of said PWM wave is pre-distorted in a digital domain through digital signal processing and using the digitized power supply voltage ripples or distortion by said ADC.

8. The all-digital class-D audio amplifier of claim 7, wherein said natural-sampling point is calculated in said digital domain through digital signal processing by finding a cross-point of a sawtooth waveform of said PWM wave with said input audio signal.

9. The all-digital class-D audio amplifier of claim 7, wherein the pre-distorted natural-sampling point is calculated in said digital domain through digital signal processing by finding a cross-point of a sawtooth waveform of said PWM wave with said input audio signal with the digitized power supply by said ADC including power supply ripples or distortion.

10. The all-digital class-D audio amplifier of claim 2, wherein power supply ripples propagating to said audio speaker and the pre-distorted PWM wave cancel each other resulting in an ideal PWM wave driving said audio speaker as if said power supply ripples were non-existent or much reduced, and therefore gaining PSRR performance for said all-digital class-D audio amplifier.

11. The all-digital class-D audio amplifier of claim 3, wherein power supply distortion due to operations of electrical components propagating to said audio speaker and the pre-distorted PWM wave cancel each other resulting in an ideal PWM wave driving said audio speaker as if said power supply distortions were non-existent or much reduced, and therefore gaining THD performance for said all-digital class-D audio amplifier.

12. The all-digital class-D audio amplifier of claim 1, further comprising a decimation circuit adapted to decimate digitized power supply ripples at a sampling rate from the frequency that said ADC operates at to said PWM wave switching frequency.

13. An all-digital class-D audio amplifier comprising:
a pulse-width modulation (PWM) wave generator adapted to generate a PWM wave;
an interpolator adapted to receive an input audio signal, up-sample said input audio signal; and down-sample said input audio signal to a PWM wave switching frequency;
an audio speaker adapted to broadcast an amplified version of said input audio signal;
a pair of metal-oxide-semiconductor field-effect transistors (MOSFETs) driven by said PWM wave and said input supply voltage, wherein said pair of MOSFETs transmit said amplified version of said input audio signal to said audio speaker;
a natural-sampling and pre-distortion circuit adapted to (i) generate a pre-distorted natural-sampling frequency point for said PWM wave switching frequency, and (ii) account for digitized power supply ripples for an input supply voltage used to drive said audio speaker;
at least a third order digital sigma-delta type modulator adapted to shape quantization noise out of said input audio signal; and
an analog-to-digital converter (ADC) adapted to digitize said power supply ripples or any power supply distortion.

14. The all-digital class-D audio amplifier of claim 1, further comprising a digital predictor circuit adapted to predict a difference in a value of said power supply voltage at anytime during an immediately subsequent PWM cycle using power supply voltage difference values from one or more immediately previous PWM cycles.

15. The all-digital class-D audio amplifier of claim 1, further comprising a power supply rejection ratio (PSRR) in a range from 20 dB to 80 dB.

16. The all-digital class-D audio amplifier of claim 1, further comprising a power efficiency of greater than 90% for low-power portable digital audio applications in an approximate range of 10-100 mW.

17. A system for amplifying an audio signal, said system comprising:
digital circuitry;
an audio signal source adapted to generate an input audio signal;
an audio speaker adapted to transmit an amplified input audio signal;
a pair of metal-oxide-semiconductor field-effect transistors (MOSFETs) adapted to transmit said amplified input audio signal to said audio speaker; and
a class-D audio amplifier adapted to achieve a power supply rejection ratio (PSRR) in a range of 20 dB to 80 dB, wherein said class-D audio amplifier comprises:
a pulse-width modulation (PWM) wave generator adapted to generate a PWM wave, wherein said PWM wave drives said pair of MOSFETs;
an interpolator adapted to receive an input audio signal, up-sample said input audio signal; and down-sample said input audio signal to a PWM wave frequency;
a natural-sampling and pre-distortion circuit adapted to (i) generate a pre-distorted natural-sampling frequency point for said PWM wave frequency, and (ii) account for digitized power supply ripples for an input supply voltage used to drive said audio speaker;
at least a third order digital sigma-delta type modulator adapted to shape quantization noise out of said input audio signal; and
an analog-to-digital converter (ADC) adapted to digitize said power supply ripples, wherein said ADC operates at a frequency that is higher than said PWM wave frequency;
wherein said digital circuitry is adapted to:
provide a PSRR performance using digital signal processing and by digitizing said power supply ripples using said ADC; and
provide a reduced total harmonic distortion (THD) using digital signal processing and by digitizing said power supply distortion using said ADC.

18. A method of amplifying an audio signal transmitted through an audio speaker, said method comprising:
generating an input audio signal;
generating a pulse-width modulation (PWM) wave;
up-sampling and down-sampling said input audio signal to a PWM wave switching frequency;
generating a pre-distorted natural-sampling frequency point for said PWM wave switching frequency;
shaping quantization noise out of said input audio signal using at least a third order digital sigma-delta type modulator;
digitizing a power supply ripple for an input supply voltage used to drive said audio speaker; and
transmitting the digitized audio signal through said audio speaker,
wherein said digitized audio signal comprises a power supply rejection ratio (PSRR) in a range of 20 dB to 80 dB.

19. The method of claim 18, further comprising providing a PSRR performance by using digital signal processing to pre-distort a natural-sampling point of said PWM wave and by digitizing said power supply ripples using said ADC.

20. The method of claim 18, further comprising providing reduced total harmonic distortion (THD) by using digital signal processing to pre-distort a natural-sampling point of said PWM wave and by digitizing said power supply ripples using said ADC.

21. The all-digital class-D audio amplifier of claim 8, wherein the cross-point of said sawtooth waveform of said PWM wave with said input audio signal is dependent upon a slope of said input audio signal or a time-varying rate of said input audio signal amplitude, and wherein said cross-point is computed using digital signal processing implemented by digital circuitry.

* * * * *